United States Patent
Zheng et al.

(10) Patent No.: US 10,249,789 B2
(45) Date of Patent: Apr. 2, 2019

(54) LIGHT EMITTING DIODE CHIP AND FABRICATION METHOD

(71) Applicant: XIAMEN SANAN OPTOELECTRONICS TECHNOLOGY CO., LTD., Xiamen (CN)

(72) Inventors: Jiansen Zheng, Xiamen (CN); Su-Hui Lin, Xiamen (CN); Chen-Ke Hsu, Xiamen (CN); Chih-Wei Chao, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 0 days.

(21) Appl. No.: 15/658,375

(22) Filed: Jul. 24, 2017

(65) Prior Publication Data

US 2017/0324002 A1    Nov. 9, 2017

Related U.S. Application Data

(63) Continuation of application No. 15/186,487, filed on Jun. 19, 2016, now Pat. No. 9,825,203, which is a
(Continued)

(30) Foreign Application Priority Data

Dec. 31, 2013    (CN) .......................... 2013 1 0747994

(51) Int. Cl.
*H01L 33/24*    (2010.01)
*H01L 33/14*    (2010.01)
(Continued)

(52) U.S. Cl.
CPC .............. *H01L 33/24* (2013.01); *H01L 33/14* (2013.01); *H01L 33/145* (2013.01); *H01L 33/44* (2013.01);
(Continued)

(58) Field of Classification Search
CPC ....... H01L 33/14; H01L 33/145; H01L 33/24; H01L 33/38; H01L 33/44;
(Continued)

(56) References Cited

U.S. PATENT DOCUMENTS

| | | | |
|---|---|---|---|
| 2009/0050909 A1* | 2/2009 | Chen ...................... | H01L 33/20 257/88 |
| 2010/0301462 A1* | 12/2010 | Sinha .................. | H01L 21/7682 257/632 |
| 2015/0214431 A1* | 7/2015 | Chou ..................... | H01L 29/34 257/13 |

* cited by examiner

*Primary Examiner* — Shahed Ahmed
(74) *Attorney, Agent, or Firm* — Syncoda LLC; Feng Ma

(57) ABSTRACT

A light-emitting diode chip includes an epitaxial layer with a plurality of recess portions and protrusion portions; and a light transmission layer having a plurality of light transmission portions between top ends of adjacent protrusion portions and forming holes with the recess portions. The light transmission portions have a horizontal dimension larger than a width of the top ends of two adjacent protrusion portions, and serve as current blocking layer. A current spreading layer covers the light transmission layer and the epitaxial layer not masked by the light transmission layer. A refractive index of the light transmission layer is between those of the epitaxial layer and the holes, indicating a difference of refractive index between the light transmission layer and the epitaxial layer. Light scattering probability can therefore be increased, thus avoiding light absorption by electrodes and improving light extraction efficiency.

15 Claims, 17 Drawing Sheets

Related U.S. Application Data continuation of application No. PCT/CN2014/086727, filed on Sep. 17, 2014.

(51) Int. Cl.
  *H01L 33/44* (2010.01)
  *H01L 33/38* (2010.01)
(52) U.S. Cl.
  CPC ...... *H01L 33/38* (2013.01); *H01L 2933/0016* (2013.01); *H01L 2933/0033* (2013.01)
(58) Field of Classification Search
  CPC ..... H01L 2933/0016; H01L 2933/0033; H01L 31/143; H01L 33/18; H01L 33/22
  See application file for complete search history.

LIGHT EMITTING DIODE CHIP AND FABRICATION METHOD

CROSS-REFERENCE TO RELATED APPLICATIONS

The present application is a continuation of, and claims priority to, U.S. patent application Ser. No. 15/186,487 filed on Jun. 19, 2016, which is a continuation of PCT/CN2014/086727 filed on Sep. 17, 2014, which claims priority to Chinese Patent Application No. 201310747994.9 filed on Dec. 31, 2013. The disclosures of these applications are hereby incorporated by reference in their entirety.

BACKGROUND

Featured with small size, high efficiency and long service life, light emitting diode is widely used in fields like traffic light and outdoor full color display and is becoming a study hot point in electronics field.

To get high-luminance LED, the key is to improve the internal and external quantum efficiency. The light extraction efficiency of chip is a main factor constraining the external quantum efficiency. As the refractive indices of epitaxial material, substrate material and air differ a lot, the light produced at the light emitting layer will be totally reflected at the material interfaces with different refractive indices and cannot be exported from the chip. Therefore, study on improving light emitting efficiency of LED is active, mainly including: change of chip's geometric profile, use of inverted pyramid structure, resonant cavity or photonic crystal. It can be seen that chip structure design is of great importance to improve the light-emitting efficiency of LED.

Chinese Patent Application No. 200910037641.3 discloses a light emitting diode with current blocking layer, comprising a substrate, an N-type semiconductor material layer formed on the front side of the substrate, a light emitting layer formed on the N-type semiconductor material layer, a P-type semiconductor material layer formed on the light emitting layer, a transparent electrode layer formed on the P-type semiconductor material layer, an anode metal electrode bonding line layer formed on the transparent electrode layer and a cathode metal electrode bonding line layer formed on the N-type semiconductor material layer, bonding lines formed on the anode metal electrode bonding line layer and the cathode metal electrode bonding line layer, and a current blocking layer at the local position under the anode metal electrode bonding line layer and between the transparent electrode layer and the P-type semiconductor material layer.

SUMMARY

The inventors of the present disclosure have recognized that the current blocking layer in existing technologies can be configured to reduce current accumulation under the wafer electrode and further the absorption of light by the electrode, but make a limited increase of light emitting efficiency due to the failure to fully reflect the light by the current blocking layer.

The technical problem to be solved by some embodiments of the present disclosure is to improve the above limitations of the prior art, thus further improve the current blocking/spreading property, increase light emitting efficiency and luminance of light emitting diode chip and cut production cost.

The technical schemes below are adopted in some embodiments of the present disclosure to solve the technical problems:

Various embodiments disclosed herein provide a light emitting diode chip, comprising an epitaxial layer, which includes from the bottom up at least a type I semiconductor layer, a light emitting layer and a type II semiconductor layer and with a plurality of recess portions and protrusion portions on the top layer; a light transmission layer, located between the top ends of the adjacent protrusion portions and forming holes with the recess portions the horizontal size of which is larger than the width of the top ends of two adjacent protrusion portions.

Some embodiments provide another light emitting diode chip, comprising an epitaxial layer which includes from the bottom up at least a type I semiconductor layer, a light emitting layer and a type II semiconductor layer and with a plurality of recess portions and protrusion portions at the central part area on the top layer; a dielectric layer, located between the top ends of the adjacent protrusion portions and forming holes with the recess portions the horizontal size of which is larger than the width of the top ends of two adjacent protrusion portions; a current spreading layer covering the surface of the dielectric layer and the surface of the epitaxial layer of non-mask dielectric layer; a first electrode formed on a current spreading layer and vertically corresponding to the dielectric layer.

Various embodiments also provide a fabrication method of a light emitting diode, comprising the following steps: (1) a substrate is provided; (2) an epitaxial layer is formed on the substrate, which includes from the bottom up at least an epitaxial layer with a plurality of recess portions and protrusion portions on the top layer; (3) a light transmission layer formed on the epitaxial layer, specifically, located between the top ends of the adjacent protrusion portions and forming holes with the recess portions the horizontal size of which is larger than the width of the top ends of two adjacent protrusion portions; (4) a current spreading layer in film structure and continuously distributed, covering the surface of the light transmission layer and the surface of an epitaxial layer of a non-mask light transmission layer.

Following Step (4), the fabrication method can further comprise (5) directly fabricating the first electrode and the second electrode, respectively arranged above part of the current spreading layer and below the substrate, or (5) firstly removing part of the epitaxial layer to expose part of the type I semiconductor layer, and then (6) fabricating the first electrode and the second electrode, respectively arranged above part of the current spreading layer and above part of the type I semiconductor layer.

Some embodiments also provide another fabrication method of light emitting diode, comprising the following steps: (1) a substrate is provided; (2) an epitaxial layer is formed on the substrate, composed of from the bottom up at least a type I semiconductor layer, a light emitting layer and a type II semiconductor layer and with a plurality of recess portions and protrusion portions at the central part area on the top layer; (3) a dielectric layer formed on the epitaxial layer, specifically, located between the top ends of the adjacent protrusion portions and forming holes with the recess portions the horizontal size of which is larger than the width of the top ends of two adjacent protrusion portions; (4) a current spreading layer in film structure and continuously distributed, covering the surface of the dielectric layer and the surface of the epitaxial layer of non-mask dielectric layer;

Following Step (4), the fabrication method can further comprise (5) directly fabricating a first electrode and a second electrode, respectively arranged above part of the current spreading layer and below the substrate, or (5) firstly removing part of the epitaxial layer to expose part of the type I semiconductor layer, and then (6) fabricating a first electrode and a second electrode, respectively arranged above part of the current spreading layer and part of the type I semiconductor layer.

Preferably, a hollow cell is left between two adjacent transmission layers.

Preferably, the light transmission layer is periodically distributed.

Preferably, the light transmission layer is of nanoball or nanoline or nanorod structure.

Preferably, the light transmission layer is made of dielectric layer or conducting layer or the combination of the two.

Preferably, the dielectric layer is made of $SiO_2$ or $SiN_x$ or $Al_2O_3$ or $TiO_2$ or AlN or the combination of them.

Preferably, the conducting layer is made of ITO or ZnO or CTO or InO or In doped with ZnO or Al doped with ZnO or Ga doped with ZnO or the combination of them.

Preferably, the refractive index of the light transmission layer is between those of the epitaxial layer and the air.

Preferably, the light emitting diode chip also comprises the current spreading layer, covering the surface of the dielectric layer and the surface of the epitaxial layer of the non-mask dielectric layer.

Preferably, the current spreading layer is of a continuously distributed film structure.

Preferably, the current spreading layer is made of ITO or ZnO or CTO or InO or In doped with ZnO or Al doped with ZnO or Ga doped with ZnO or the combination of them.

Preferably, the light emitting diode chip also comprises the substrate positioned oppositely to the epitaxial layer; and the substrate is epitaxial substrate or thermal conducting substrate or electro conducting substrate or insulating substrate.

Preferably, the light emitting diode chip also comprises a first electrode and a second electrode, respectively arranged above part of the light transmission layer and below the substrate.

Preferably, the light emitting diode chip also comprises the first electrode and the second electrode, respectively arranged above part of the current spreading layer and below the substrate.

Preferably, the light emitting diode chip also comprises the first electrode and the second electrode, respectively arranged above part of the light transmission layer and part of the type I semiconductor layer.

The disclosure has at least the following beneficial effects: by controlling the position relation between the light transmission layer and the epitaxial layer with protruded and recessed micro structure, the light transmission layer is placed between the top ends of two adjacent protrusion portions of the epitaxial layer and forms with the recessed part a hole structure which functions as a current blocking layer; the light transmission layer is a dielectric layer to block current and so current accumulation under chip electrode is eliminated to a great extent; the light transmission layer is also an electro conducting layer to diffuse current and so current injection efficiency is improved and working voltage of devices is decreased; as the refractive index of the light transmission layer is between those of the epitaxial layer and the hole (the air), indicating a difference of refractive index between the light transmission layer and the epitaxial layer, the probability of scattering generated when the light rays from a luminescent layer emits upwards can be increased, thus avoiding the absorption of light by electrode and further improving light extraction efficiency. In addition, metal film as a reflecting layer is not needed, cutting production cost.

BRIEF DESCRIPTION OF THE DRAWINGS

101: substrate; 102: epitaxial layer; 103: first semiconductor layer; 104: light emitting layer; 105: second semiconductor layer; 106: protruded part; 107: recessed part; 108: light transmission layer; 109: holes; 110: hollow cell; 111: current spreading layer; 112: P electrode; 113: N electrode; 201: substrate; 202: epitaxial layer; 203: first semiconductor layer; 204: light emitting layer; 205: second semiconductor layer; 206: protruded part; 207: recessed part; 208: light transmission layer; 209: holes; 210: hollow cell; 211: current spreading layer; 212: P electrode; 213: N electrode; 301: substrate; 302: epitaxial layer; 303: first semiconductor layer; 304: light emitting layer; 305: second semiconductor layer; 306: protruded part; 307: recessed part; 308: light transmission layer; 309: holes; 310: hollow cell; 311: current spreading layer; 312: P electrode; 313: N electrode; 401: substrate; 402: epitaxial layer; 403: first semiconductor layer; 404: light emitting layer; 405: second semiconductor layer; 406: protruded part; 407: recessed portion; 408: dielectric layer; 409: light transmission layer; 410: holes; 411: hollow cell; 412: current spreading layer; 413: P electrode; 414: N electrode; 501: substrate; 502: epitaxial layer; 503: first semiconductor layer; 504: light emitting layer; 505: second semiconductor layer; 506: protruded part; 507: recessed portion; 508: first light transmission layer; 509: second light transmission layer; 510: holes; 511: hollow cell; 512: current spreading layer; 513: P electrode; 514: N electrode; 601: substrate; 602: epitaxial layer; 603: first semiconductor layer; 604: light emitting layer; 605: second semiconductor layer; 606: protruded part; 607: recessed portion; 608: dielectric layer; 609: holes; 610: current spreading layer; 611: P electrode; 612: N electrode; 701: substrate; 702: epitaxial layer; 703: first semiconductor layer; 704: light emitting layer; 705: second semiconductor layer; 706: protruded part; 707: recessed part; 708: dielectric layer; 709: holes; 710: current spreading layer; 711: P electrode; 712: N electrode; 801: substrate; 802: epitaxial layer; 803: first semiconductor layer; 804: light emitting layer; 805: second semiconductor layer; 806: protruded part; 807: recessed part; 808: dielectric layer; 809: holes; 810: current spreading layer; 811: P electrode; 812: N electrode.

DETAILED DESCRIPTION

Further detailed description will be made to the disclosure with the following embodiments.

Embodiment 1

Figure 1:
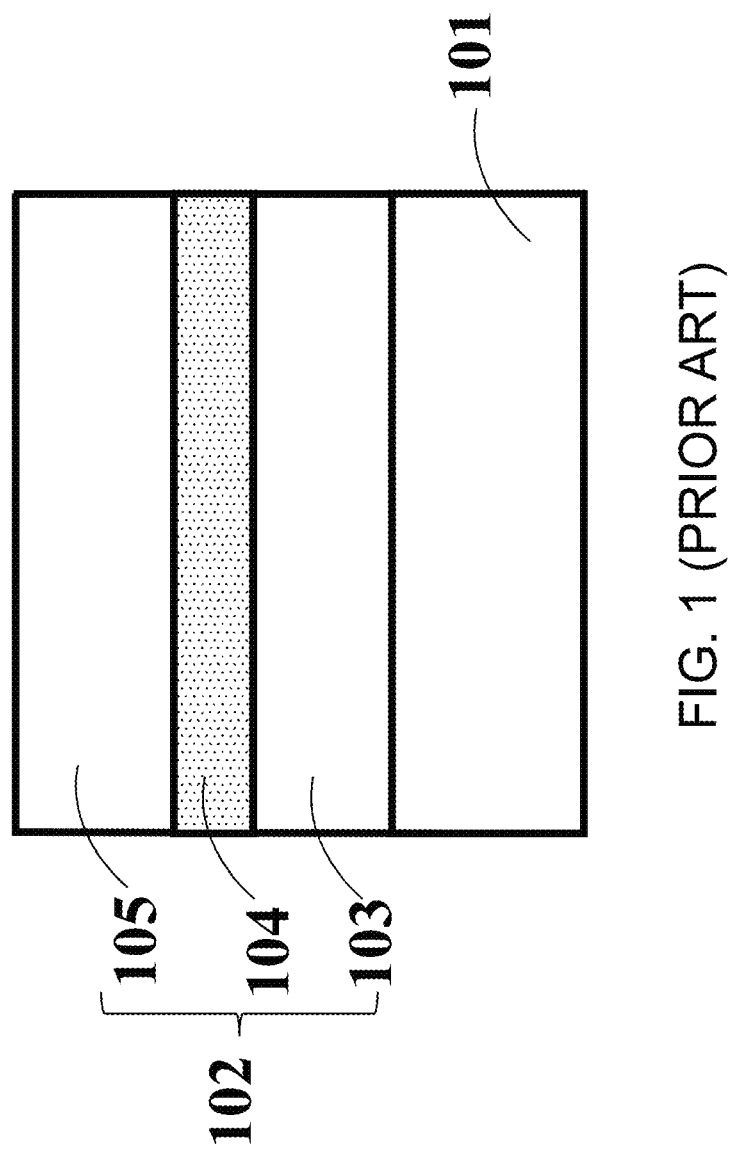
FIG. 1 is schematic diagram of a first step of a fabrication process for the LED chip of Embodiment 1.
Figure 2:
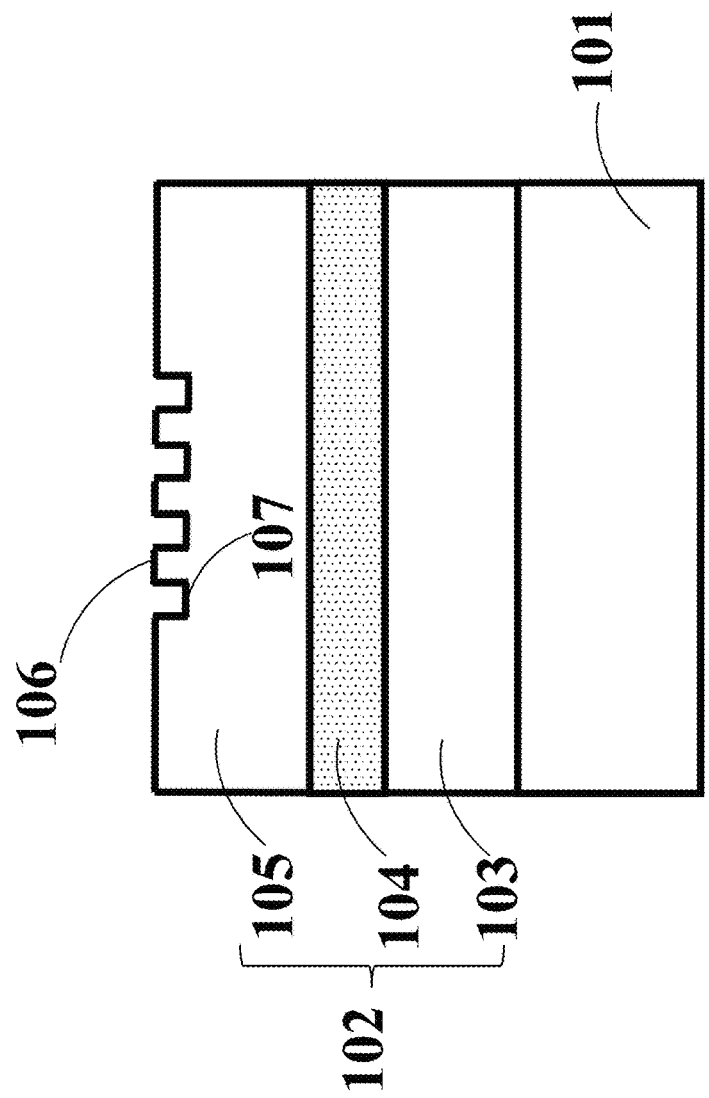
FIG. 2 illustrates a second step.

A fabrication procedure of the light emitting diode chip, comprising:

Step 1: as shown in FIG. 1, a substrate 101 is provided, where the substrate can be an epitaxial substrate, a thermal conducting substrate, an electro conducting substrate or an insulating substrate. In this embodiment, preferably, silicon (Si) is used as an epitaxial substrate, and in other embodiments, the substrate can be an $Al_2O_3$ substrate, a SiC substrate, a GaN substrate, a GaAs substrate, a GaP substrate, an AlN substrate or a Cu substrate. Through metal organic chemical vapor phase deposition (MOCVD), an epitaxial layer 102 is formed on the substrate, on which from bottom upwards a first semiconductor layer 103, a light emitting layer 104 and a second semiconductor layer 105 are stacked, with the first semiconductor layer 103 electrically opposite to the second semiconductor layer 105, i.e., when the first semiconductor layer 1-3 is N-type, the second semiconductor layer 105 is P-type, vice versa; in this embodiment, the first semiconductor layer 103 is an N-type GaN layer, the second semiconductor layer 105 is a P-type GaN layer, and the light emitting layer 104 is a multi-quantum well (MQW) made of InGaN/GaN. In other embodiments, the first semiconductor layer 103, the second semiconductor layer 105 and the light emitting layer 104 can be made up of other components than the above;

Step 2: as shown in FIG. 2, etching process is adopted to form a protruded and recessed micro structure on the top layer of the epitaxial layer, comprising a plurality of protrusion portions 106 and recess portions 107, and the etching process is not limited to dry etching, and wet etching is also an option. The protruded and recessed micro structure can also be formed during the epitaxial layer fabricating process by adjusting the technological parameters, rather than being limited to the chip fabricating process. It should be noted that the position of the protruded and recessed micro structure is not limited to the inside of the epitaxial layer; rather, it can be formed on the surface of the epitaxial layer by introducing other protruded and recessed micro structure like periodic array-shaped dielectric layer.

Figure 3:
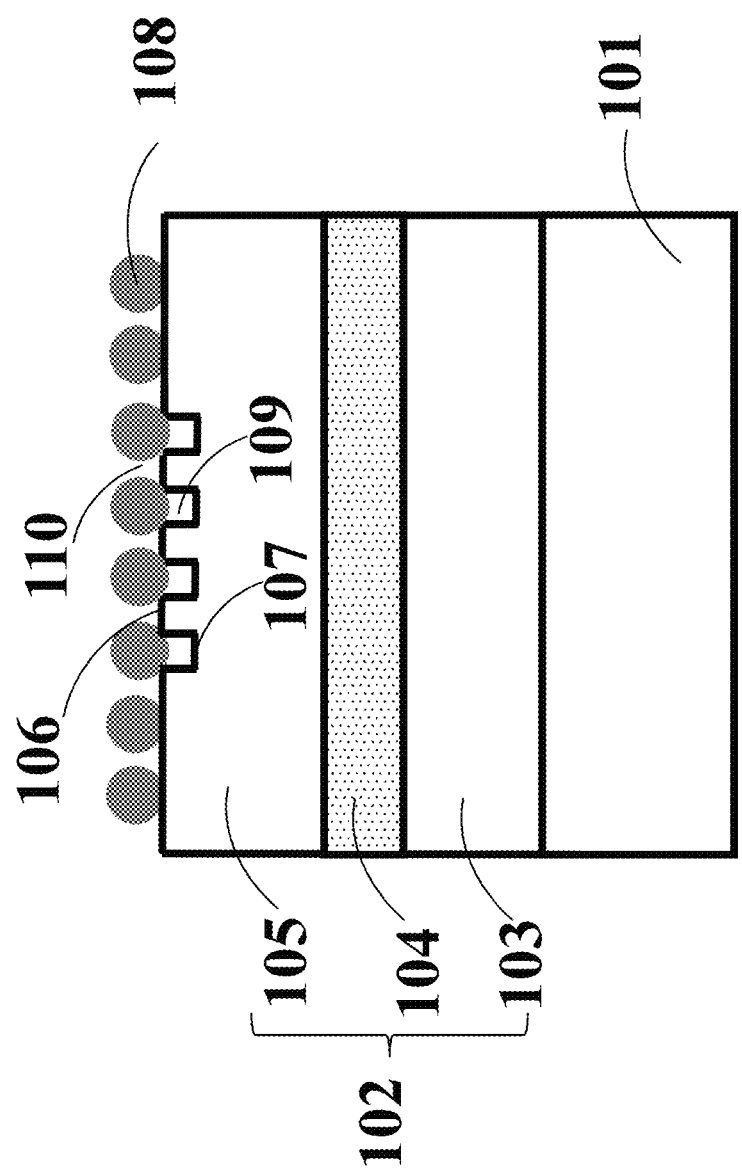
FIG. 3 illustrates a third step.

Step 3: as shown in FIG. 3, nano-imprinting process is adopted to form a light transmission layer 108 on the epitaxial layer 102, specifically, between the top ends of two adjacent protrusion portions 106, forming holes 109 with the recess portions 107 the horizontal size of which is larger than the width of the top ends of two adjacent protrusion portions; adjacent light transmission layers contacts each other by dot, line or plane, or are separate from each other, and in this embodiment, adjacent light transmission layers 108 do not contact each other but being distributed periodically with an interval of 200 nm, thus forming a hollow cell 110; the light transmission layer is of nano ball or nano line or nano column structure, and in this embodiment, the light transmission layer 108 is preferably of nano ball structure with wire diameter of 10-500 nm, preferably 200 nm; the light transmission layer 108 is made of dielectric layer or conducting layer, and in this embodiment, the conducting layer is preferably a conducting layer, made of ITO or ZnO or CTO or InO or In doped with ZnO or Al doped with ZnO or Ga doped with ZnO, preferably made of ITO in this embodiment, and the refractive index of the light transmission layer is between those of the epitaxial layer and the air.

Figure 4:
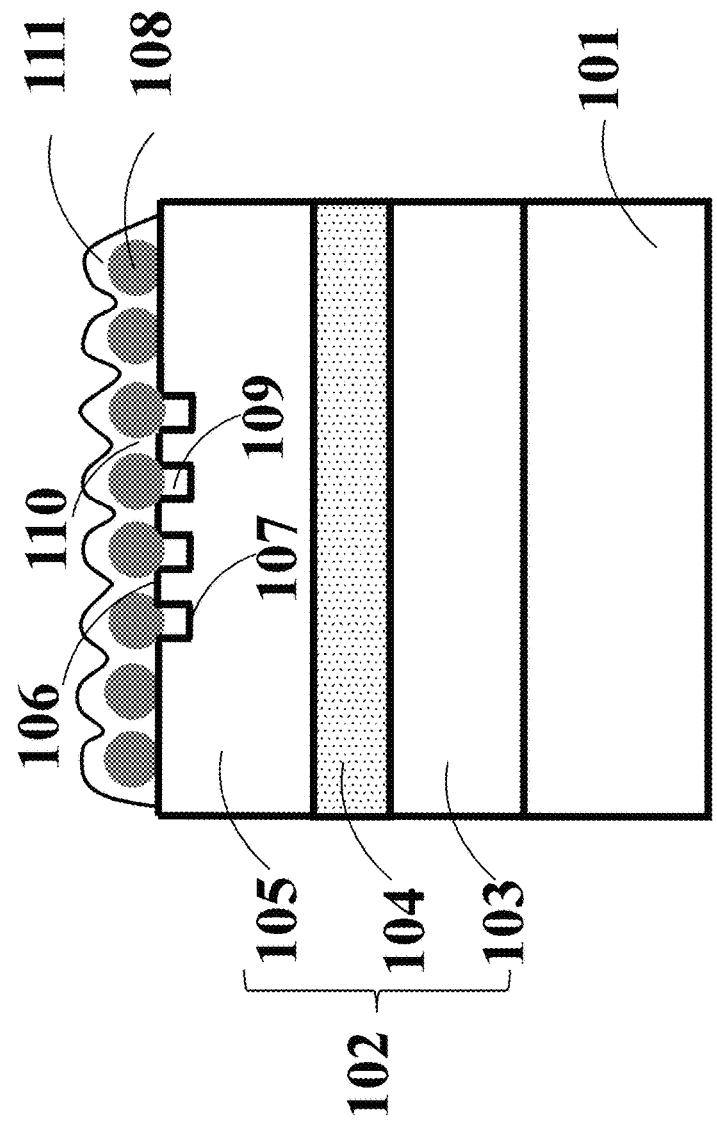
FIG. 4 illustrates a fourth step.

Step 4: as shown in FIG. 4, a current spreading layer 111 in film structure and continuously distributed covers the surface of the light transmission layer 108 and the surface of the epitaxial layer of the non-mask light transmission layer 108, and the current spreading layer is made of ITO or ZnO or CTO or InO or In doped with ZnO or Al doped with ZnO or Ga doped with ZnO, preferably made of ITO in this embodiment, the same as the light transmission layer 108, so avoiding internal damage of the light emitting diode and guaranteeing low working voltage while having good light intensity of the light emitting diode. The current spreading layer 111 can be formed by vacuum evaporation or electronic beam evaporation or radio frequency (RF) or sputtering or plasma chemical vapor deposition (PECVD), preferably by sputtering in this embodiment.

Figure 5:
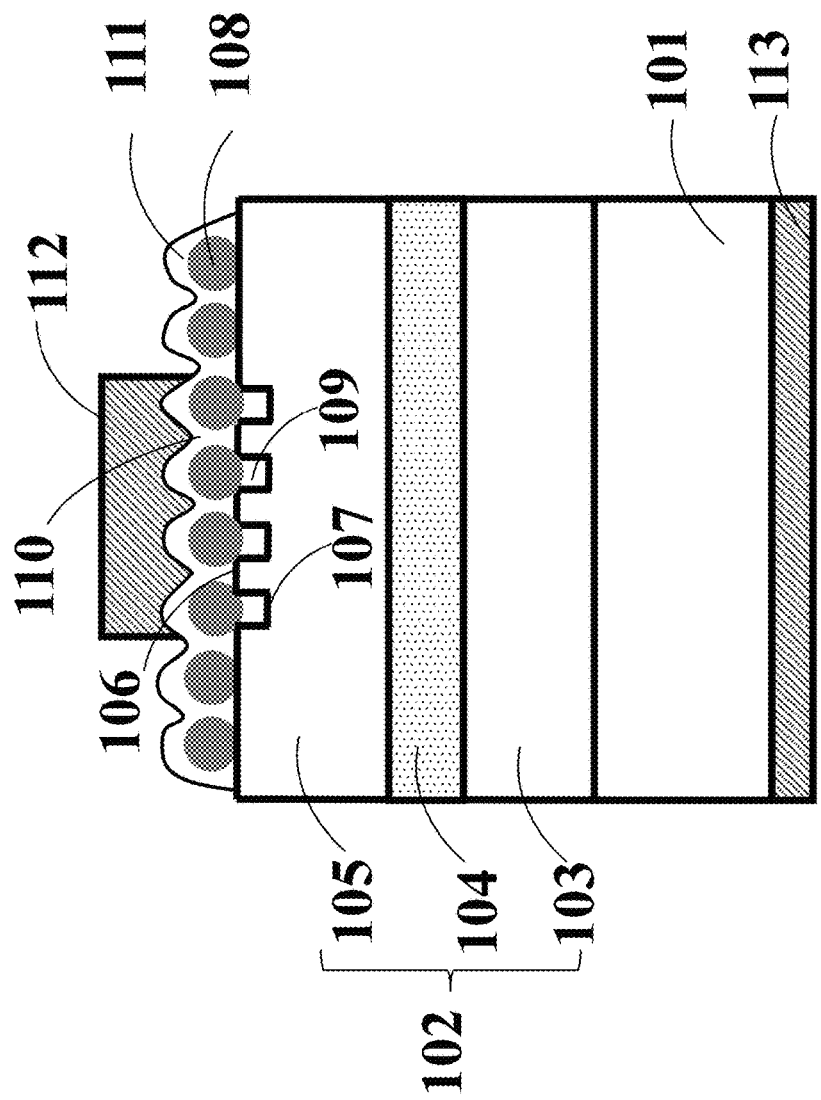
FIG. 5 illustrates a fifth step.

Step 5: as shown in FIG. 5, P electrode 112 and N electrode 113 are fabricated above part of the current spreading layer 111 and below the substrate 101, and it should be noted that since the substrate 101 is made of silicon substrate with electrical conductivity, N electrode 113 below the substrate 101 can be spared.

As shown in FIG. 5, the light emitting diode chip made by the above method has a structure composed of the silicon substrate 101 at the bottom; the epitaxial layer 102 with protruded and recessed micro structure and formed on the silicon substrate 101, comprising from bottom upwards the first semiconductor layer 103, the light emitting layer 104 and the second semiconductor layer 105 and the top layer, namely, the second semiconductor layer 105, having a plurality of protrusion portions 106 and recess portions 107 on the surface; ITO light transmission layer 108 in nano ball structure, located between the top ends of adjacent protrusion portions 106 and forming holes 109 with the recess portions 107, the horizontal size of which is larger than the width of the top ends of two adjacent protrusion portions, adjacent light transmission layers distributed periodically without contacting, thus forming the hollow cell 110; ITO current spreading layer 111 in film structure and continuously distributed, covering the surface of the light transmission layer and the surface of the epitaxial layer of the non-mask light transmission layer; P electrode 112, formed on part of the ITO current spreading layer 111; and N electrode 113, formed below the silicon substrate 101.

The structure of the above light emitting diode chip adopts the combination of the light transmission layer and the epitaxial layer with protruded and recessed micro structure, having the light transmission layer located between the top ends of the adjacent protrusion portions and forming holes with the recess portions as the current blocking layer; the light transmission layer diffuses current and so current injection efficiency is improved, working voltage of devices is decreased and finally LED luminous efficiency and brightness are improved.

Embodiment 2

Figure 6:
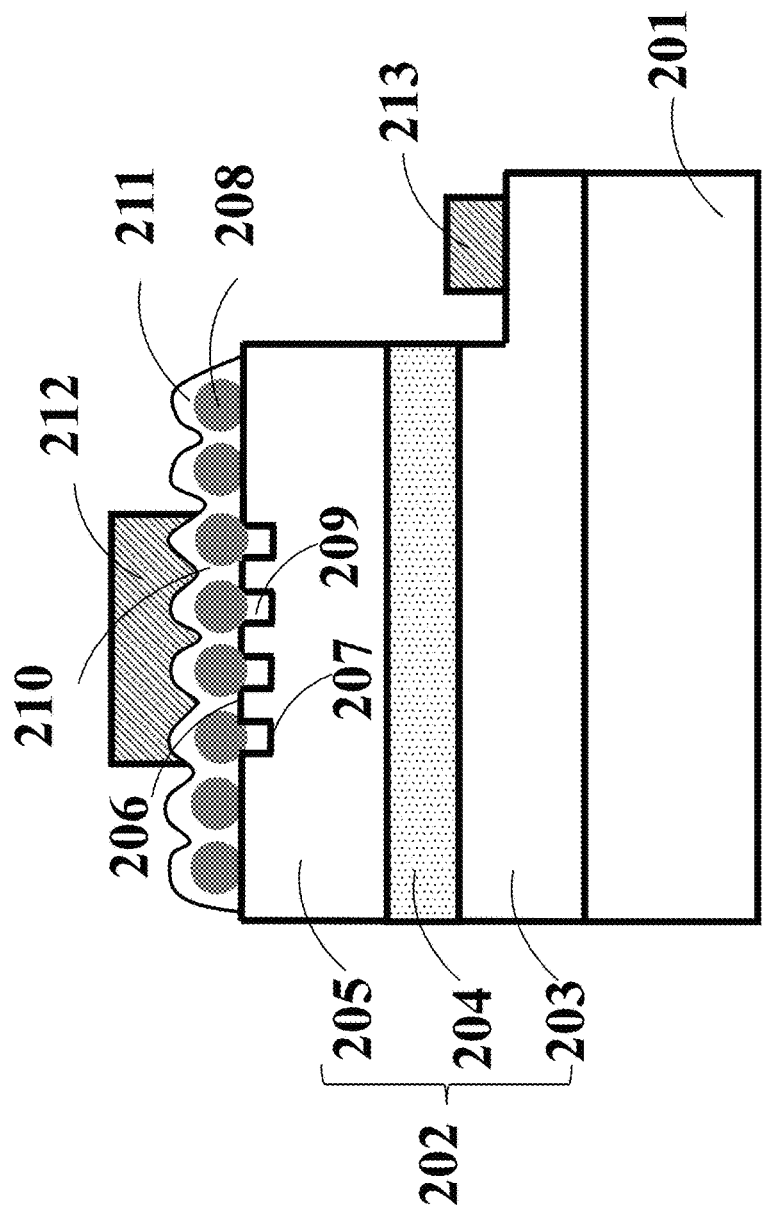
FIG. 6 is the sectional view of a light emitting diode according to Embodiment 2 of the present disclosure.

As shown in FIG. 6, different from Embodiment 1, this embodiment discloses a light emitting diode chip in structure with electrodes on the same surface. In this embodiment, sapphire substrate is adopted as the epitaxial substrate 201, and P electrode 212 and N electrode 213 are respectively made above part of the current spreading layer 211 and the exposed first semiconductor layer 203.

Embodiment 3

Figure 7:
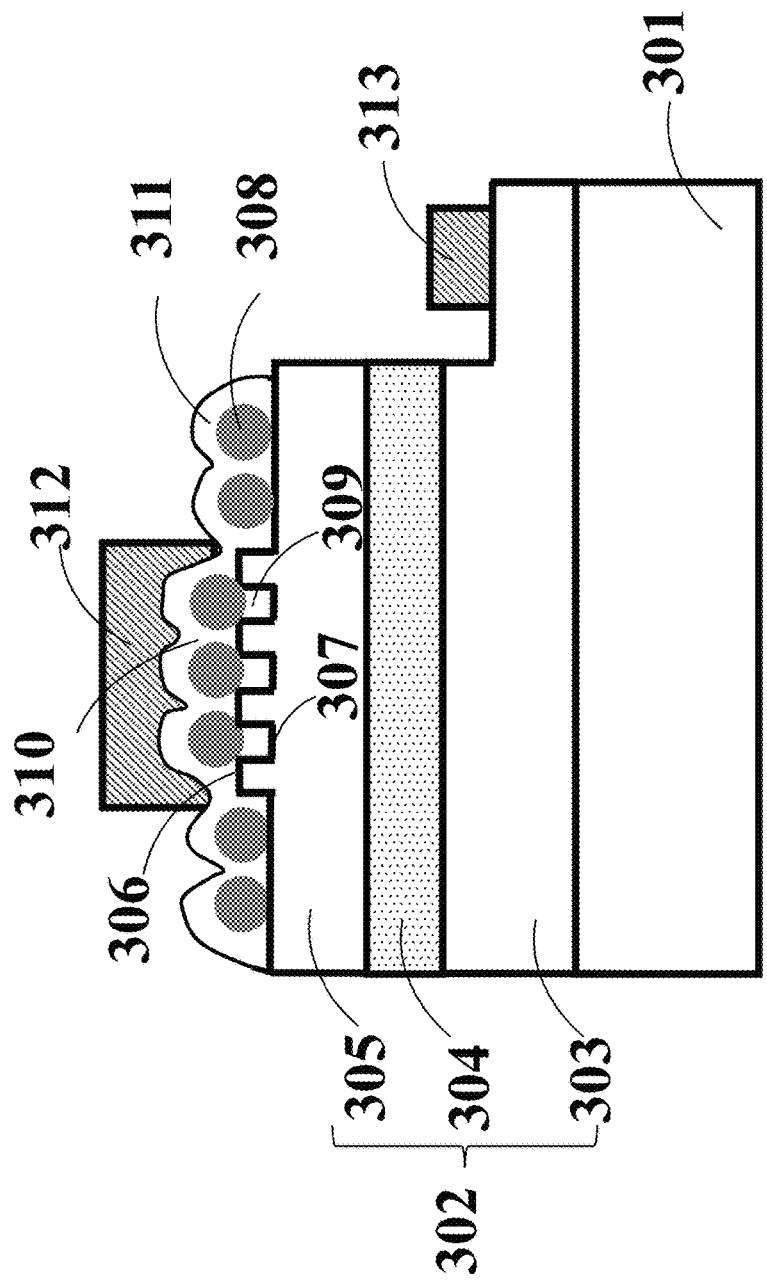
FIG. 7 is the sectional view of a light emitting diode according to Embodiment 3 of the present disclosure.

As shown in FIG. 7, different from Embodiment 2, the top layer of the epitaxial layer of this embodiment adopts a protruded and recessed micro structure, the recessed part 307 is on the same surface as the surface of the second semiconductor layer 305, while the protruded part 206 of Embodiment 2 is on the same surface as the surface of the second semiconductor layer 205.

Embodiment 4

Figure 8:
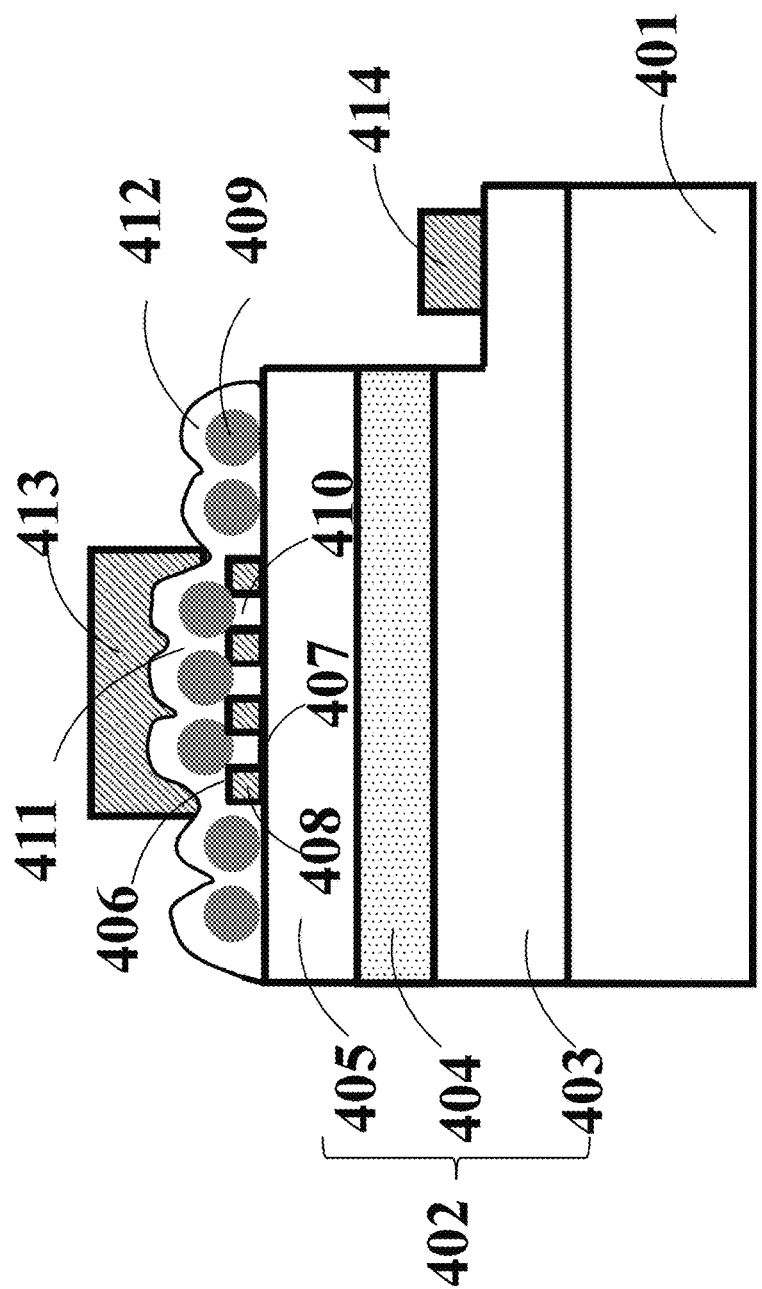
FIG. 8 is the sectional view of a light emitting diode according to Embodiment 4 of the present disclosure.

As shown in FIG. 8, different from Embodiment 2, the protruded and recessed micro structure on the top layer of the epitaxial layer of this embodiment is formed by the periodically arranged dielectric layer 408 with low refractive index, and the dielectric layer 408 is made of $SiO_2$ or $SiN_x$ or $Al_2O_3$ or $TiO_2$ or AlN or the combination of them, preferably in this embodiment made of $SiO_2$. As the light transmission layer 409 is placed between the top ends of two adjacent protrusion portions 406 and forms with the recessed part 407 a hole structure 408, the hole 408 functions as a current blocking layer, and in addition, the dielectric layer 408 of protruded and recessed micro structure also can block the current, and the combination of the hole and the dielectric layer will greatly eliminate current accumulation under the chip electrode.

Embodiment 5

Figure 9:
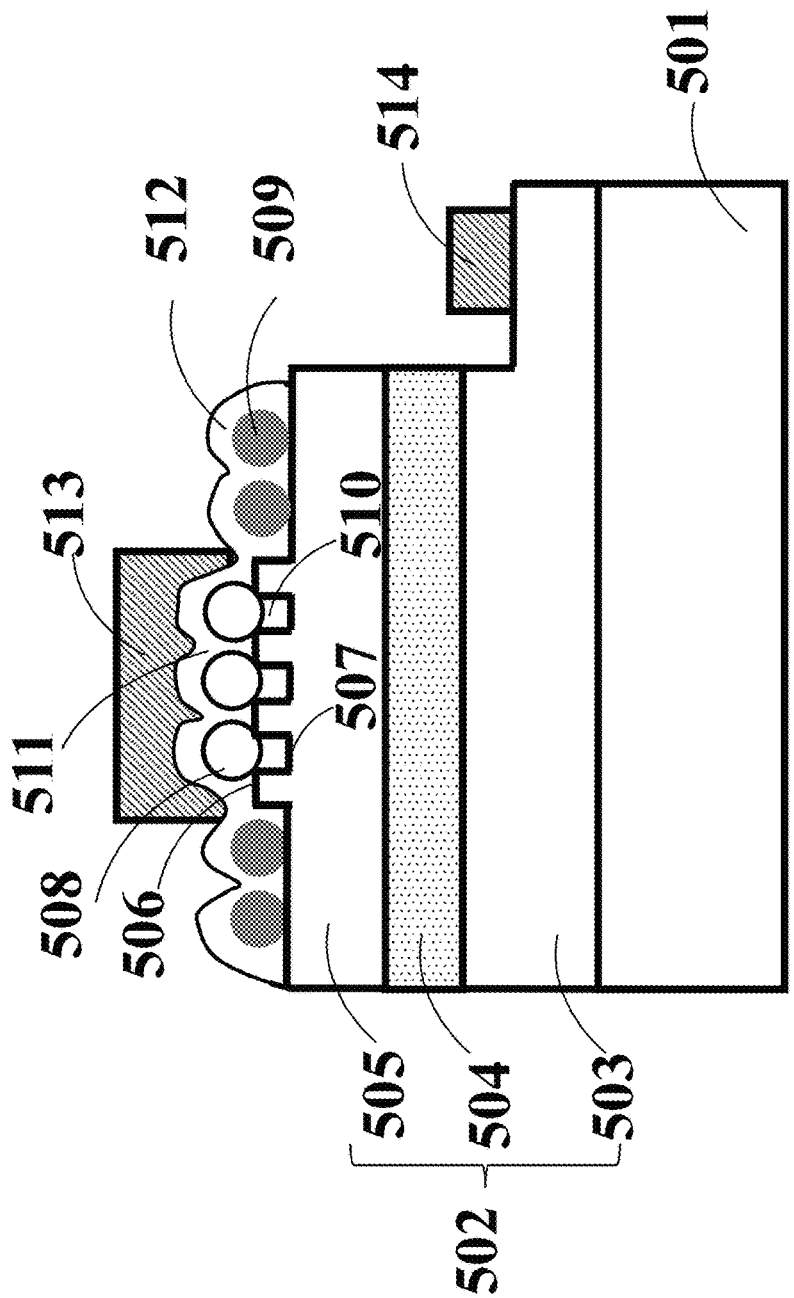
FIG. 9 is the sectional view of a light emitting diode according to Embodiment 5 of the present disclosure.

As shown in FIG. 9, different from Embodiment 3, the light transmission layer is composed of the first light transmission layer and the second light transmission layer, the first light transmission layer 508 is made of dielectric layer and on the protruded and recessed micro structure on the top layer of the epitaxial layer, and the second light transmission layer 509 is made of electro conducting layer and on the surface of the second semiconductor layer of the epitaxial layer. As the first light transmission layer 508 is placed between the top ends of two adjacent protrusion portions 506 and forms with the recessed part a hole structure 510, the hole 510 functions as the current blocking layer, and in addition the first light transmission layer 508 made of the dielectric layer 408 also can block the current, the combination of the hole and the dielectric layer will greatly eliminate current accumulation under the chip electrode.

Embodiment 6

Figure 10:
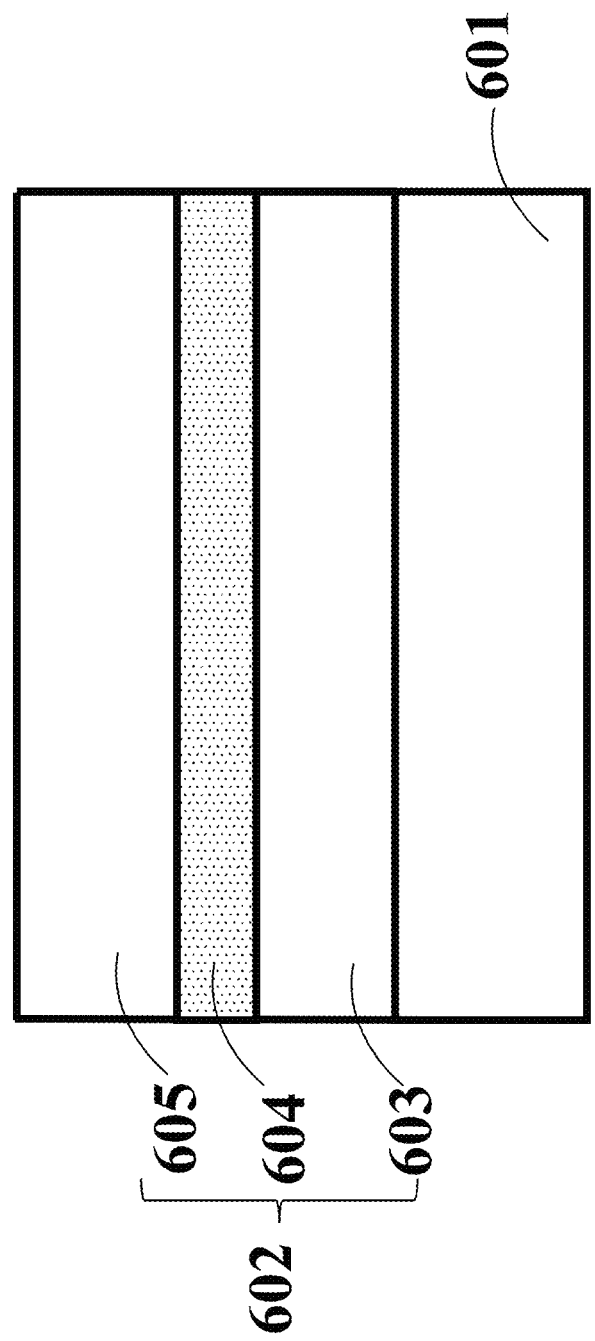
FIG. 10 is a schematic sectional view of a first step of fabrication process of a light emitting diode in Embodiment 6 of the present disclosure.

Step 1: as shown in FIG. 10, the $Al_2O_3$ substrate 601 is provided, and the epitaxial layer 602 is formed on the substrate by MOCVD method, on which the first semiconductor layer 603, the light emitting layer 604 and the second semiconductor layer 605 are from bottom upwards stacked.

Figure 11:
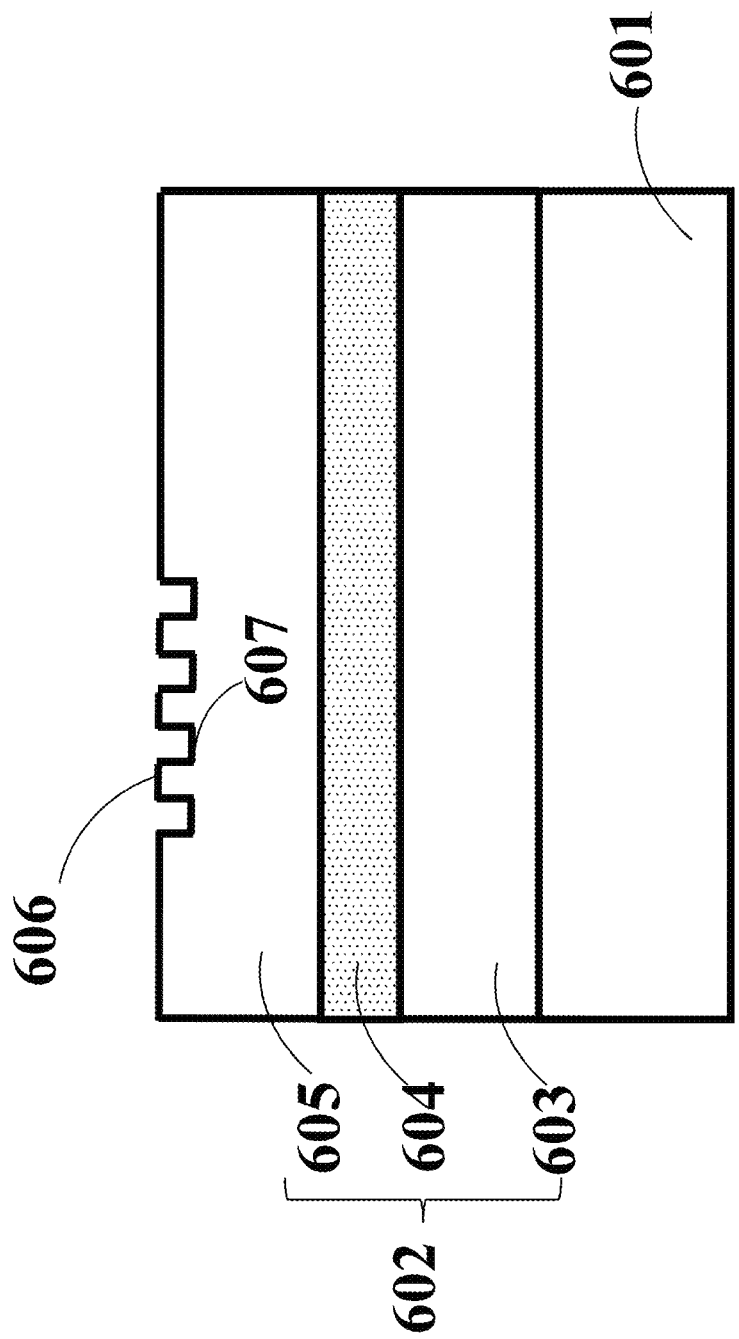
FIG. 11 illustrates a second step.

Step 2: as shown in FIG. 11, etching process is adopted to form a protruded and recessed micro structure on the central part area of the top layer of the epitaxial layer, comprising a plurality of protrusion portions 606 and recess portions 607.

Figure 12:
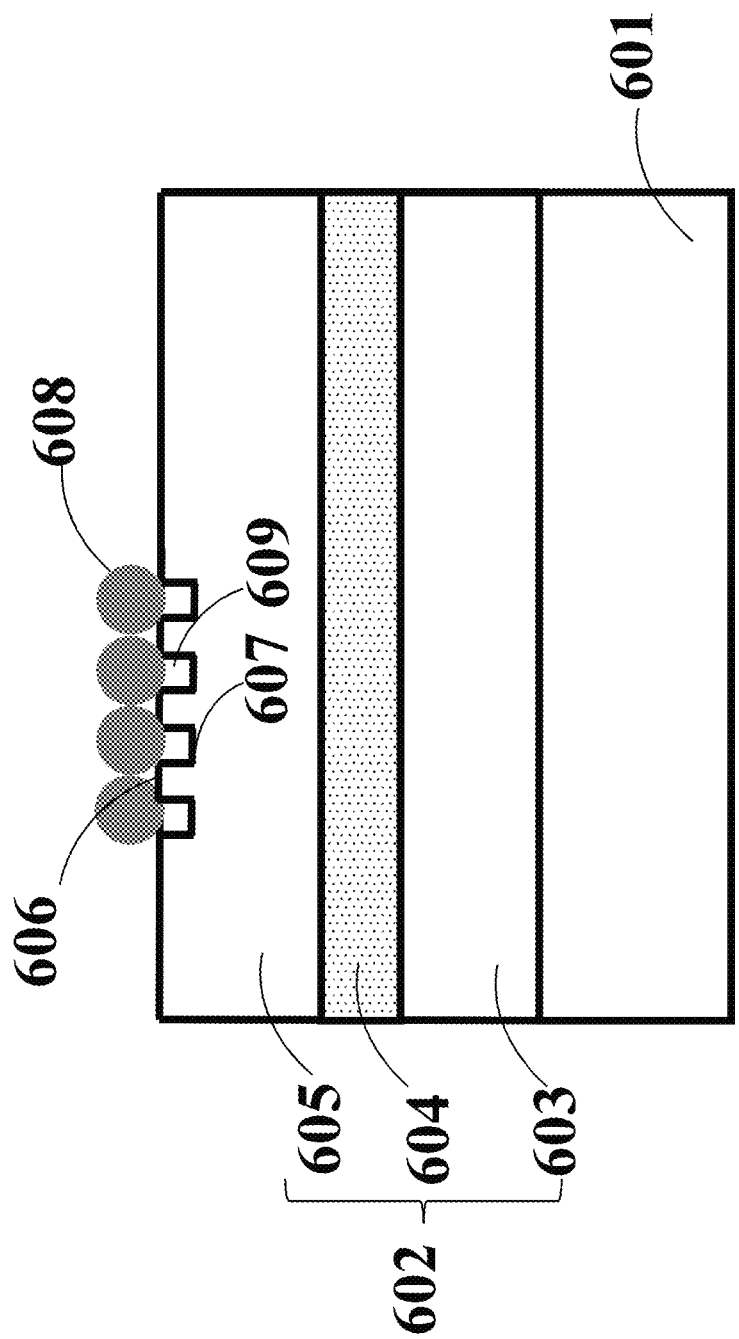
FIG. 12 illustrates a third step.

Step 3: as shown in FIG. 12, nano-imprinting process is adopted to form the dielectric layer 608 on the epitaxial layer 602, specifically, between the top ends of two adjacent protrusion portions 606, forming holes 609 with the recess portions 607 the horizontal size of which is larger than the width of the top ends of two adjacent protrusion portions; the dielectric layer 608 is made of $SiO_2$ or $SiN_x$ or $Al_2O_3$ or $TiO_2$ or AlN or the combination of them, preferably in this embodiment made of $SiO_2$ and the refractive index between those of the epitaxial layer and the air.

Figure 13:
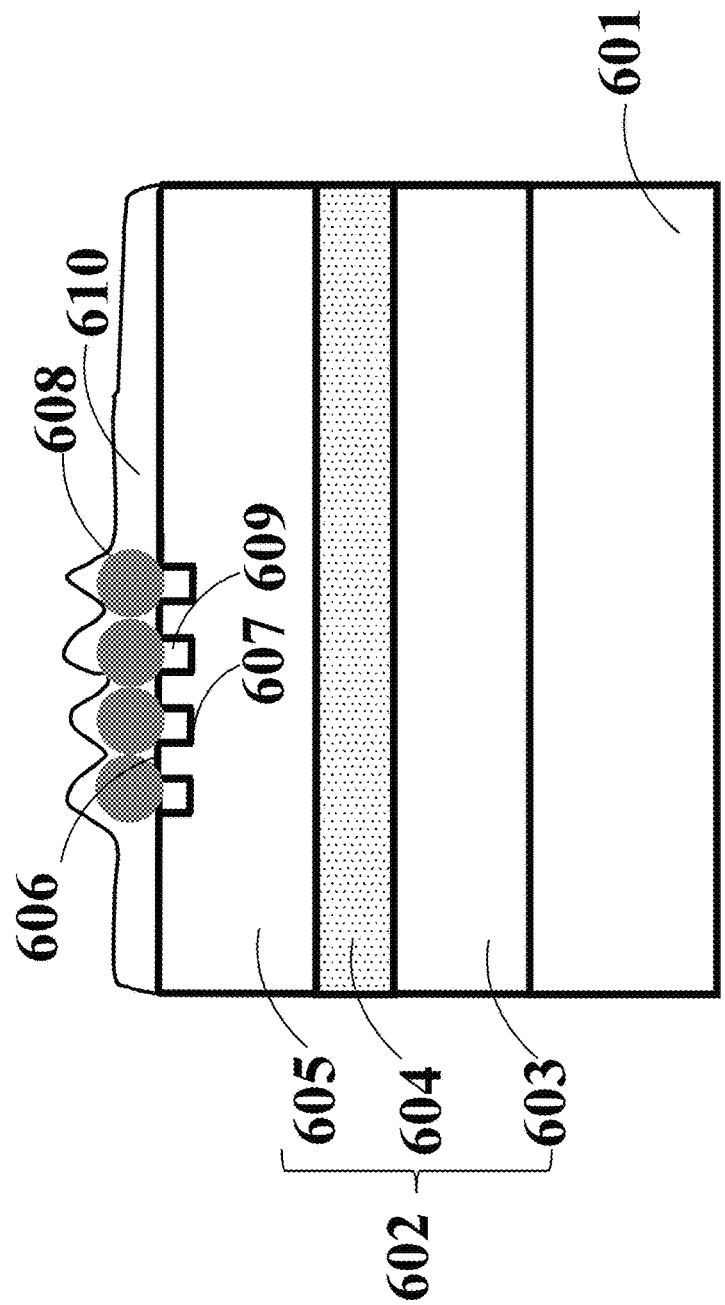
FIG. 13 illustrates a fourth step.

Step 4: as shown in FIG. 13, the current spreading layer 610 in film structure and continuously distributed covers the surface of the light transmission layer 608 and the surface of the epitaxial layer of the non-mask dielectric layer 608, and the current spreading layer is made of ITO or ZnO or CTO or InO or In doped with ZnO or Al doped with ZnO or Ga doped with ZnO, preferably made of ZnO in this embodiment.

Figure 14:
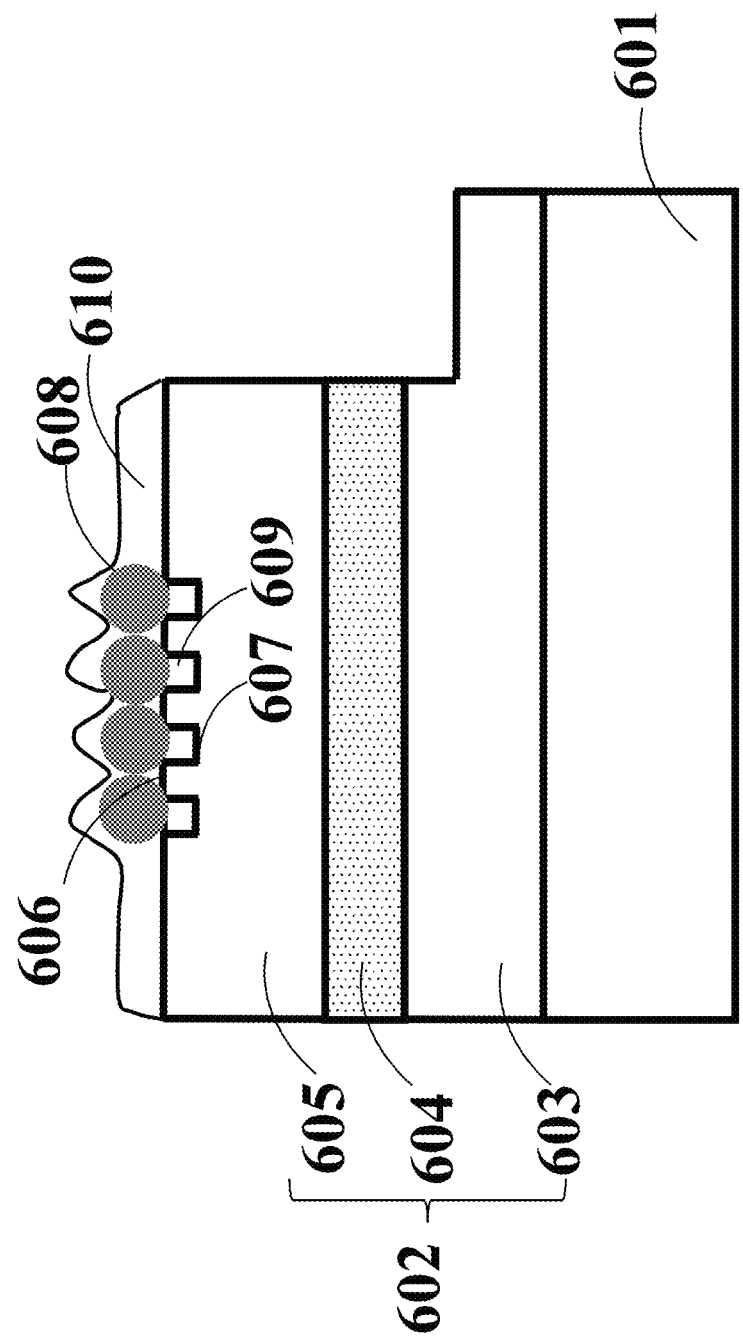
FIG. 14 illustrates a fifth step.

Step 5: as shown in FIG. 14, as insulative $Al_2O_3$ substrate is adopted as the substrate 601 in this embodiment, and electrodes on the same surface are needed, dry etching process is adopted to etch from the current spreading layer 610 to the first semiconductor layer 603, and so part of the first semiconductor layer 603 platform is exposed for subsequent N electrode fabrication.

It should be noted that the exposed first semiconductor layer platform in the embodiment is formed in Step 5, yet it can be done before the forming of the current spreading layer and the etching process is not limited to dry etching, rather, wet etching is also an option.

Figure 15:
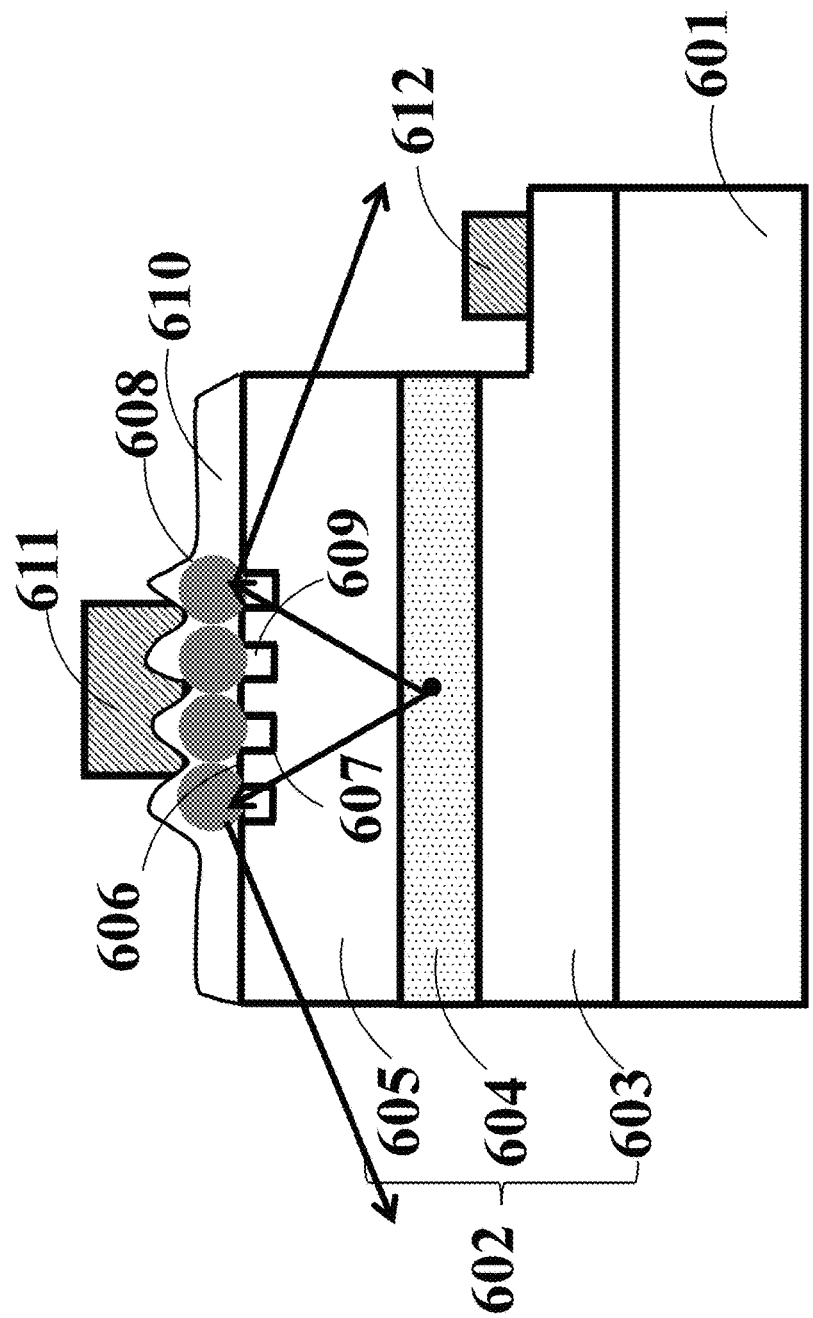
FIG. 15 illustrates a sixth step.

Step 6: as shown in FIG. 15, P electrode 611 and N electrode 612 are fabricated above part of the current spreading layer 610 and the exposed first semiconductor layer 603.

As shown in FIG. 15, the light emitting diode chip made by the above method has a structure composed of the sapphire substrate 601 at the bottom; the epitaxial layer 602 with protruded and recessed micro structure and formed on the sapphire substrate 601, comprising from bottom upwards the first semiconductor layer 603, the light emitting layer 604 and the second semiconductor layer 605, and the second semiconductor layer 605 has a plurality of protrusion portions 606 and recess portions 607 on the surface; $SiO_2$ dielectric layer 608 in nano ball structure, located between the top ends of adjacent protrusion portions 606 and forming holes 609 with the recess portions 607, the horizontal size of which is larger than the width of the top ends of two adjacent protrusion portions 606, adjacent dielectric layers 608 distributed periodically and contacting with each other; ZnO current spreading layer 111 with a thin film structure in continuous distribution, covering the surface of the dielectric layer 608 and the surface of the epitaxial layer 102 of the non-mask dielectric layer 608; P electrode 611, formed on part of the current spreading layer 610, and vertically corresponding to the dielectric layer 608; and N electrode 612, formed above the exposed first semiconductor layer 603.

As shown in the light path in FIG. 15, by utilizing that the refractive index of the dielectric layer vertically under P electrode is between those of the epitaxial layer and the hole, indicating a difference of refractive index between the dielectric layer and the epitaxial layer, the light emitting diode chip structure as abovementioned can increase the probability of scattering generated when the light rays from a luminescent layer emits upwards, thus avoiding the absorption of light by electrode and further improving light extraction efficiency. In addition, metal film as a reflecting layer is not needed, cutting production cost. As the dielectric layer is placed between the top ends of two adjacent protrusion portions and forms with the recessed part a hole structure, the hole functions as a current blocking layer, and further, the dielectric layer itself can also block the current, and the combination of the hole and the dielectric layer will greatly eliminate current accumulation under the chip electrode.

Embodiment 7

Figure 16:
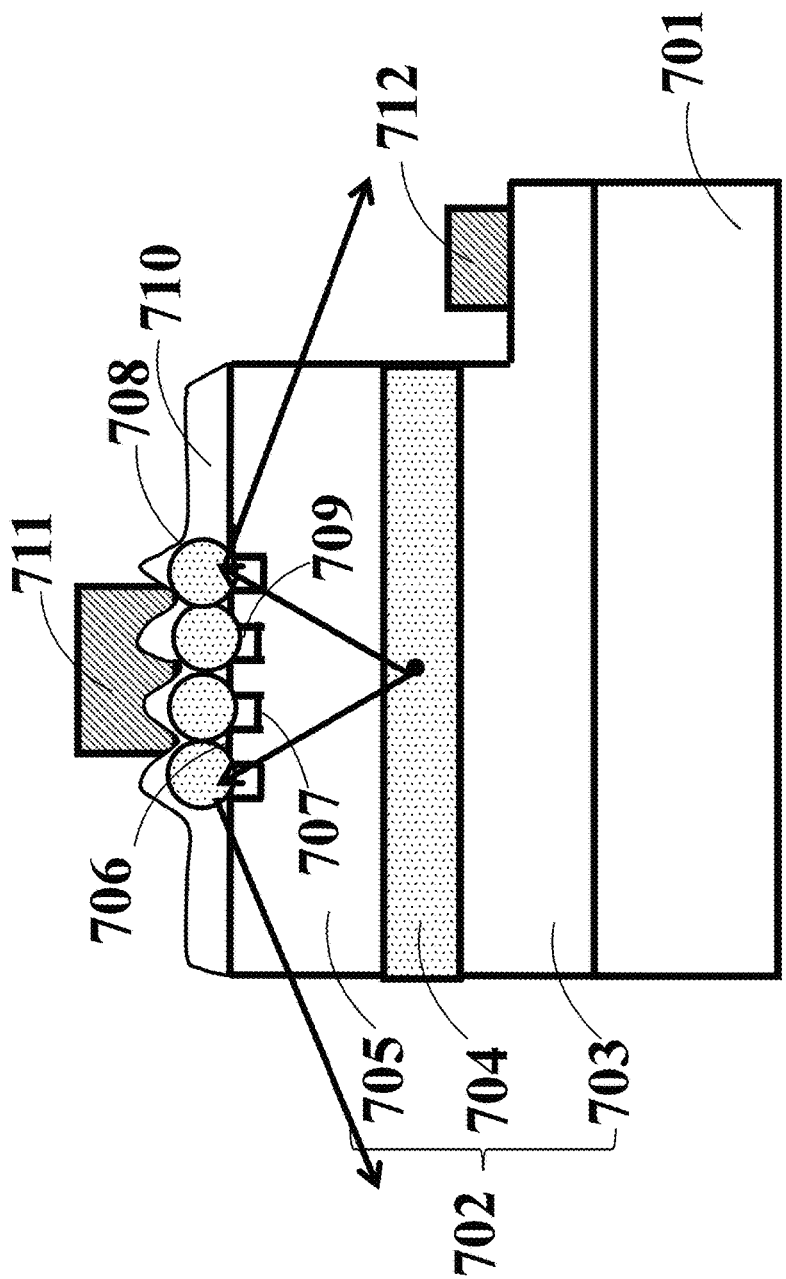
FIG. 16 is the sectional view of a light emitting diode in Embodiment 7 of the present disclosure.

As shown in FIG. 16, different from Embodiment 6, the diffusing materials doped in the dielectric layer 708 in this embodiment further enhance the diffusion effect of the dielectric layer. As the dielectric layer 708 doped with diffusing materials also functions as the blocking layer and the reflecting layer, the combined structure of the dielectric layer 708 with the hole 709 further raises the blocking and reflection effect under the P electrode in the vertical direction, thus improving the uniformity of current distribution and increasing light extraction efficiency to the greatest extent.

Embodiment 8

Figure 17:
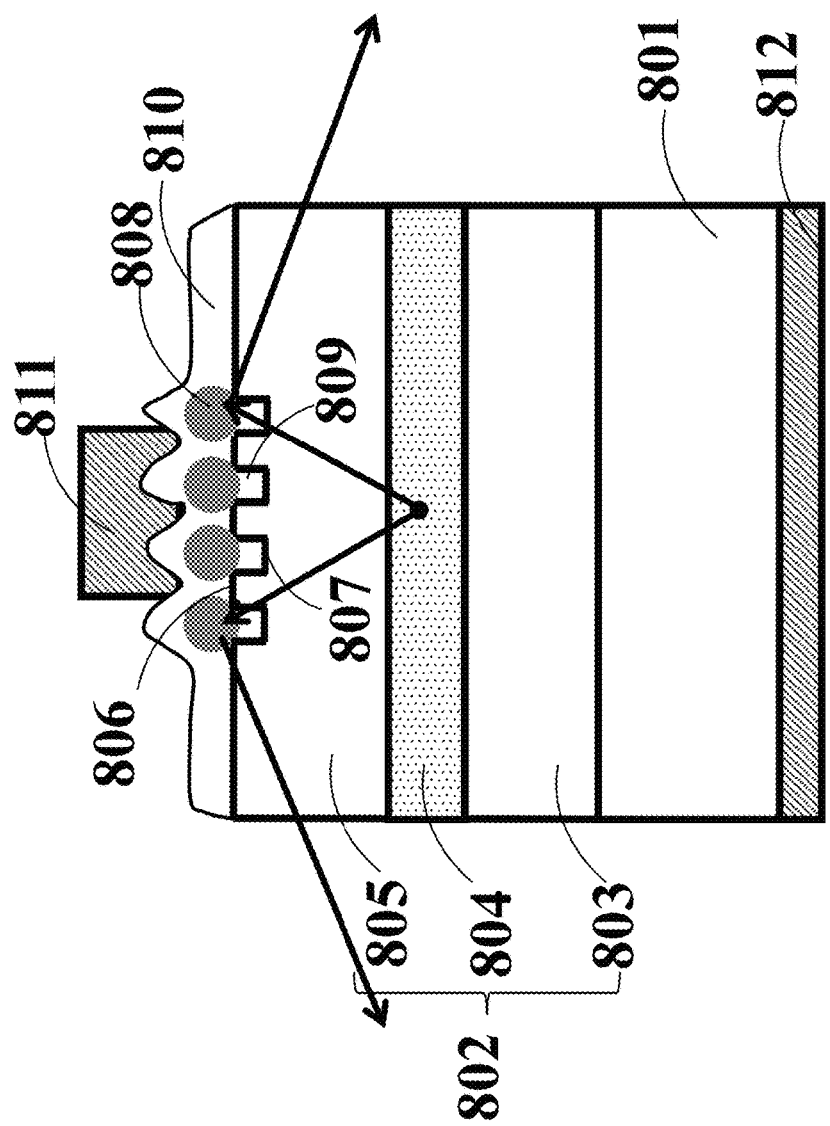
FIG. 17 is the sectional view of a light emitting diode in Embodiment 8 of the present disclosure.

As shown in FIG. 17, different from Embodiment 6, this embodiment discloses a light emitting diode chip with a vertical structure. In this embodiment, Cu substrate is adopted as the thermal dissipation substrate 801, N electrode 812 is formed on the back of the thermal dissipation substrate 801, forming an LED apparatus with a vertical structure. The light path of this embodiment is similar to that shown in FIG. 15, so details are not provided here.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A method of fabricating a light-emitting diode (LED) chip, the method comprising:
   (1) providing a substrate;
   (2) fabricating an epitaxial layer over the substrate, wherein the epitaxial layer comprises, from bottom up:
   at least a first type of a semiconductor layer;
   a light-emitting layer; and a second type of semiconductor layer with a plurality of recess portions and protrusion portions;
   (3) forming a light transmission layer over the epitaxial layer between top ends of adjacent protrusion portions and forming holes with the recess portions, wherein a horizontal size of the light transmission layer is larger than a width between two adjacent protrusion portions;
   (4) covering a top surface of the light transmission layer and a top surface of the epitaxial layer not masked by the light transmission layer with a current spreading layer with a thin-film structure in a continuous distribution; and
   (5) fabricating a first electrode and a second electrode respectively arranged over a portion of the current spreading layer and below the substrate.

2. The method of claim 1, further comprising removing a portion of the epitaxial layer to expose part of the first semiconductor layer.

3. The method of claim 1, wherein step (3) comprising a nano-imprinting process to form the light transmission layer.

4. The method of claim 3, wherein the light transmission layer comprises a plurality of light transmission portions with adjacent light transmission portions contact each other with a point contact, a line contact, or a plane contact, or are separate from each other.

5. The method of claim 4, wherein adjacent light transmission portions do not contact each other, and are distributed periodically with an interval.

6. The method of claim 5, wherein the interval is 200 nm.

7. The method of claim 5, wherein the adjacent light transmission portions form hollow cells therebetween, and wherein the light transmission layer has a nano sphere, a nano line, or a nano column structure.

8. The method of claim 7, wherein the light transmission layer has a nano sphere structure with a spherical diameter of 10 nm 500 nm.

9. The method of claim 8, wherein the spherical diameter is about 200 nm.

10. The method of claim 5, wherein the light transmission layer is composed of a dielectric layer or a conducting layer.

11. The method of claim 10, wherein the light transmission layer comprises at least one of ITO, ZnO, CTO, InO, In doped with ZnO, Al doped with ZnO, or Ga doped with ZnO.

12. The method of claim 11, wherein the light transmission layer is composed of ITO with a refractive index between a refractive index of the epitaxial layer and a refractive index of air.

13. A method of fabricating a light-emitting diode (LED) chip, the method comprising:
   (1) providing a substrate;
   (2) fabricating an epitaxial layer over the substrate, wherein the epitaxial layer comprises, from bottom up:
   a first type semiconductor layer;
   a light emitting layer; and
   a second type semiconductor layer and with a plurality of recess portions and protrusion portions at a central area of the second type semiconductor layer;
   (3) forming a light transmission layer over the epitaxial layer between top ends of the adjacent protrusion portions and thereby forming holes with the recess portions, wherein a horizontal size of the dielectric layer is larger than a width of the top ends of two adjacent protrusion portions;
   (4) covering a surface of the light transmission layer and a surface of an epitaxial layer not masked by the light transmission layer with a current spreading layer with a thin film-structure in a continuous distribution; and
   (5) fabricating a first electrode and a second electrode, respectively arranged over a portion of the current spreading layer and below the substrate.

14. The method of claim 13, further comprising removing a portion of the epitaxial layer to expose part of the first semiconductor layer.

15. The method of claim 14, further comprising fabricating a first electrode and a second electrode, respectively arranged over a portion of the current spreading layer and a portion of the first type of semiconductor layer.

* * * * *